US011811357B2

(12) United States Patent
Wang et al.

(10) Patent No.: US 11,811,357 B2
(45) Date of Patent: Nov. 7, 2023

(54) DISMANTLING DEVICE FOR FRAME OF PV MODULE

(71) Applicant: INDUSTRIAL TECHNOLOGY RESEARCH INSTITUTE, Hsinchu (TW)

(72) Inventors: Teng-Yu Wang, Hsinchu (TW); Chih-Lung Lin, Hsinchu (TW); Mu-Hsi Sung, Hsinchu (TW); Neng-Wen Hsieh, Hsinchu County (TW); Chin-Yueh Li, New Taipei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 563 days.

(21) Appl. No.: 17/134,807

(22) Filed: Dec. 28, 2020

(65) Prior Publication Data

US 2022/0094299 A1 Mar. 24, 2022

(30) Foreign Application Priority Data

Sep. 18, 2020 (TW) .................................. 109212315

(51) Int. Cl.
*B25B 27/00* (2006.01)
*H02S 30/10* (2014.01)
*B25B 11/02* (2006.01)
*B23Q 3/00* (2006.01)

(52) U.S. Cl.
CPC ................ *H02S 30/10* (2014.12); *B23Q 3/00* (2013.01); *B25B 11/02* (2013.01); *B25B 27/00* (2013.01)

(58) Field of Classification Search
CPC ......... B23P 19/02; B25B 27/16; B25B 5/067; B25B 5/101; B25B 5/082; B25B 5/125; B66F 15/00; Y10T 29/53683; Y10T 29/53896; Y10T 29/53991; Y10T 29/53996
See application file for complete search history.

(56) References Cited

U.S. PATENT DOCUMENTS

2014/0000085 A1\* 1/2014 Teller .................... F24S 25/634
29/268

FOREIGN PATENT DOCUMENTS

| CN | 201893366 U | | 7/2011 |
|---|---|---|---|
| CN | 202103080 U | | 1/2012 |
| CN | 202332932 U | \* | 7/2012 |
| CN | 103165740 | | 6/2013 |
| CN | 103406868 | | 11/2013 |
| CN | 203288629 U | | 11/2013 |

(Continued)

*Primary Examiner* — Tyrone V Hall, Jr.
(74) *Attorney, Agent, or Firm* — Maschoff Brennan

(57) ABSTRACT

The disclosed embodiments relate to a dismantling device configured for a frame of a PV module. The dismantling device includes a connection portion, a first holding portion, and a second holding portion. The first holding portion is connected to the connection portion and configured to press against one of an inner wall and outer wall of the frame. The second holding portion is slidably disposed on the connection portion and movably closer to or away from the first holding portion along a sliding direction. The second holding portion is configured to press against the other one of the inner wall and the outer wall so as to clamp the frame with the first holding portion and to distort the frame.

10 Claims, 14 Drawing Sheets

(56) References Cited

FOREIGN PATENT DOCUMENTS

| | | |
|---|---|---|
| CN | 103515472 | 1/2014 |
| CN | 103515473 | 1/2014 |
| CN | 104385109 | 3/2015 |
| CN | 105553409 | 5/2016 |
| CN | 107335985 | 11/2017 |
| CN | 108098302 | 6/2018 |
| CN | 108393329 | 8/2018 |
| CN | 108393330 | 8/2018 |
| CN | 109352299 | 2/2019 |
| CN | 109397213 | 3/2019 |
| JP | 2014116363 A | 6/2014 |
| JP | 5996045 | 9/2016 |
| JP | 6133475 | 5/2017 |
| JP | 2018030123 | 3/2018 |
| JP | 2019018172 | 2/2019 |
| KR | 101622345 | 5/2016 |

* cited by examiner

DISMANTLING DEVICE FOR FRAME OF PV MODULE

CROSS-REFERENCE TO RELATED APPLICATIONS

This non-provisional application claims priority under 35 U.S.C. § 119(a) on Patent Application No(s). 109212315 filed in Taiwan (R.O.C.) on Sep. 18, 2020, the entire contents of which are hereby incorporated by reference.

TECHNICAL FIELD

The disclosure relates to a dismantling device, more particularly to a dismantling device for frame of PV module.

BACKGROUND

Fossil fuels are gradually being used up due to human activities and the growing demand for energy, thus, in the near future, renewable-energy source technologies such as solar power are desired to surpass traditional fossil fuels in terms of usage. Solar power is the conversion of energy from sunlight into electricity using photovoltaic (PV) module (also called 'solar panel'), the module contains photovoltaic cells that use sunlight as a source of energy and generate direct current electricity that can enter into the grid or be stored in a battery for later use. Generally, PV modules are placed in areas that can get sufficient sunshine for them to make the energy. Considering that the PV modules are exposed to outdoor conditions and highly influenced by weather parameters, thus a typical PV module has an aluminum frame around its periphery in order to strengthen the structural strength and extend the service life.

All PV modules eventually degrade to where they enter their end-of-life stage, but there still are specific target materials, such as solar-grade silicon, aluminum frame, and glass, from PV waste can be recovered for second-use applications in solar panels or repurposed for other value-added applications, thus a large number of mechanical methods involved apparatuses or processes for dismantling the frame from the modules for PV module recycling had developed. The removal of the aluminum frame may also be involved when flaws such as cracks or breakage on cells are found.

It should be noted that among the processes, the most important and most difficult process is eliminating the encapsulation from the laminated structures. In this regard, some use hammer to knock the frame off or use saw to cut the frame into smaller sections, but these approaches are not effective and efficient and often cause backsheet scratches, cracks or breakages on glass plate and cells due to improper force control, affecting the quality of recovered materials and even making it more difficult to recycle.

SUMMARY

Accordingly, the present disclosure provides a dismantling device capable of removing frame of PV module in a way not damaging internal components of module.

One embodiment of the disclosure provides a dismantling device configured for a frame of a PV module. The dismantling device includes a connection portion, a first holding portion, and a second holding portion. The first holding portion is connected to the connection portion and configured to press against one of an inner wall and outer wall of the frame. The second holding portion is slidably disposed on the connection portion and movably closer to or away from the first holding portion along a sliding direction. The second holding portion is configured to press against the other one of the inner wall and the outer wall so as to clamp the frame with the first holding portion and to distort the frame.

According to the dismantling device as discussed in the above embodiments of the disclosure, the second holding portion is movable close to or away from the first holding portion so as to clamp and deform the frame together with the first holding portion, which allows user to gradually peel the frame off from the PV module by simply pulling, pushing, and/or rotating the dismantling device while largely preserving the integrity of the laminated structure.

As such, it is allowed to properly and evenly distribute force to dismantle the frame from the module. As a result, impact and damage on the internal components caused by the removal of the frame is minimized or even prevented, thus there is no longer a need to strike or cut the frame to cause backsheet scratches, cracks or breakages on glass plate and cells. In other words, the dismantling device as discussed in the above embodiments of the disclosure can separate frame from module without further damaging the internal components, achieving higher recovery/recycling rate and improving the quality of recovered materials.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Figure 1:
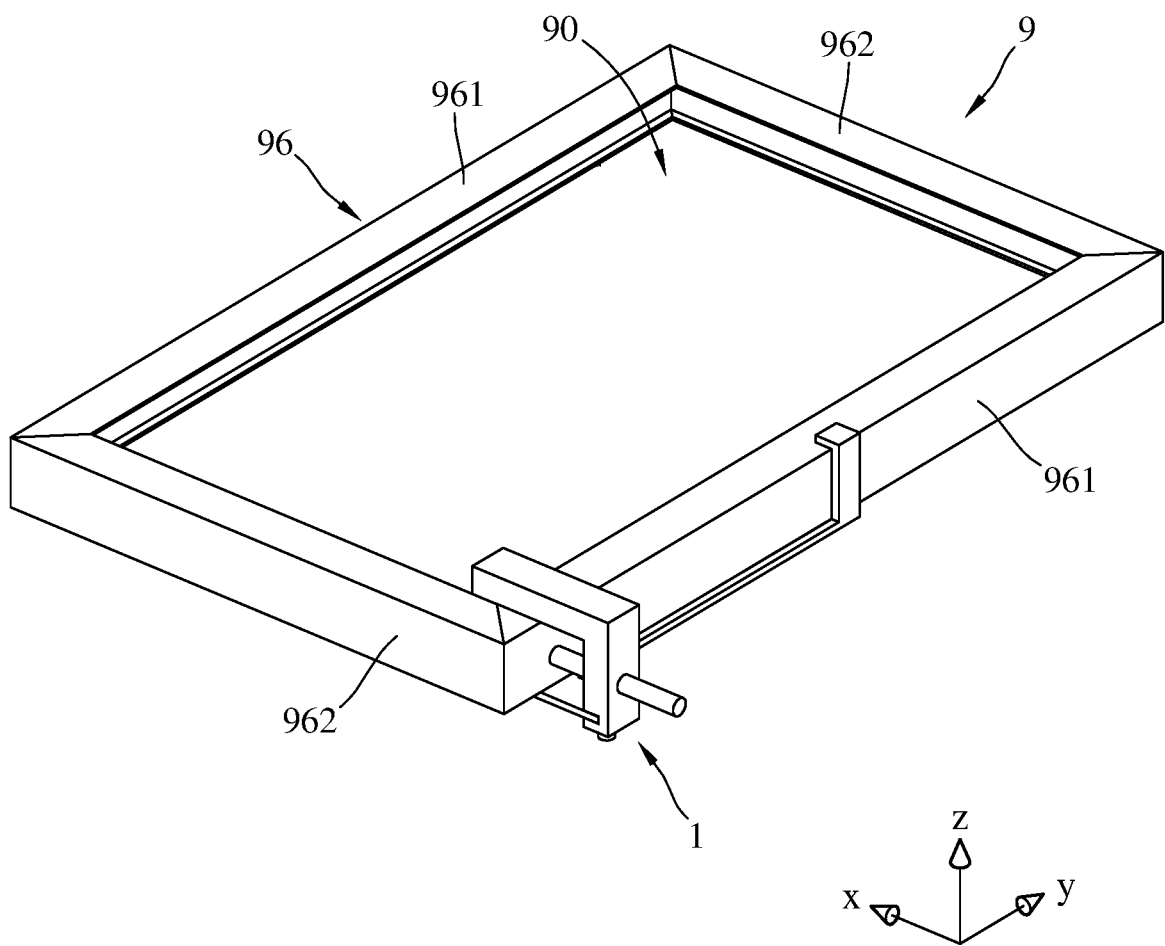
FIG. 1 is a perspective view of a dismantling device being used on a PV module according to one embodiment of the disclosure.
Figure 2:
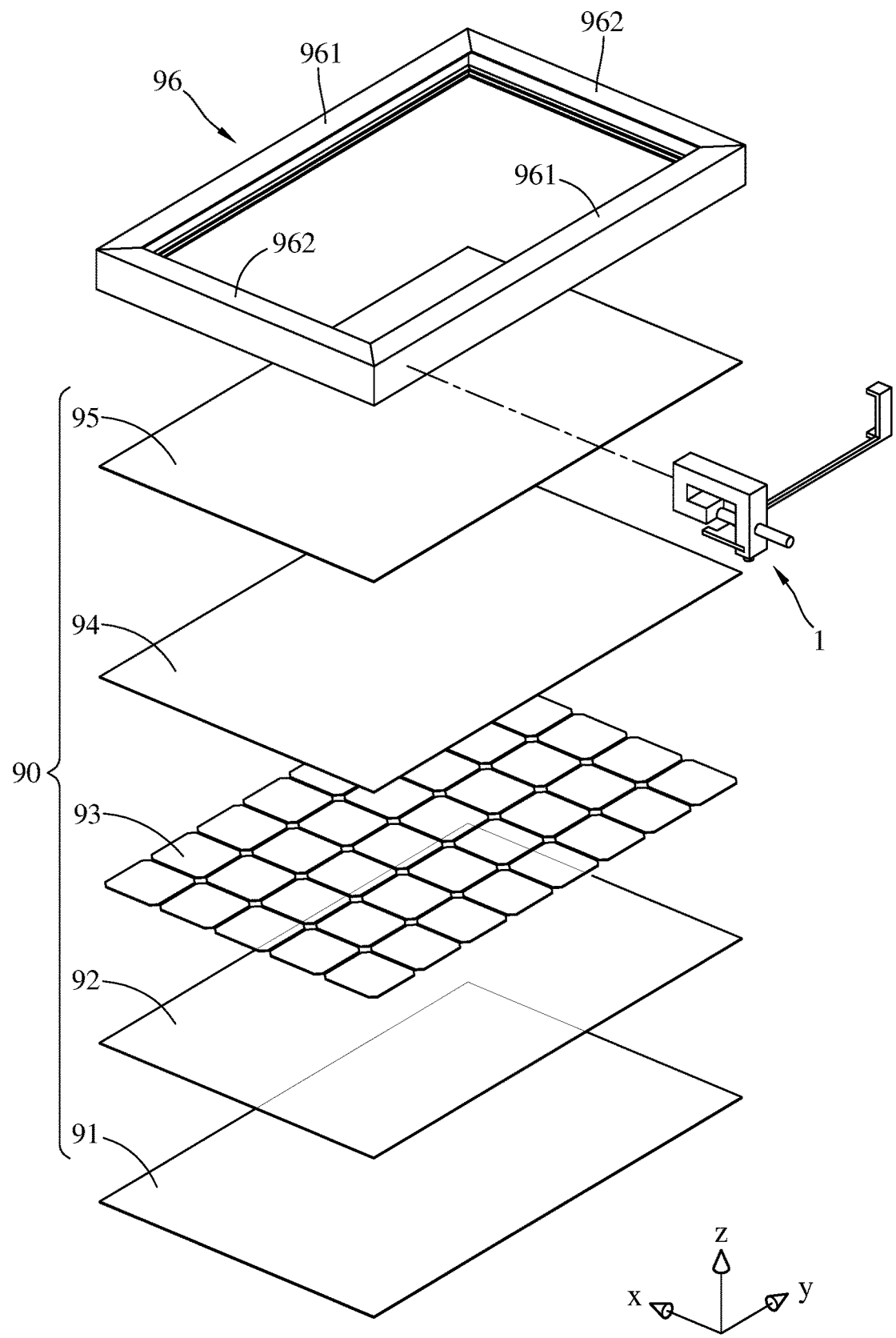
FIG. 2 is an exploded view of the dismantling device and the PV module in FIG. 1.
Figure 3:
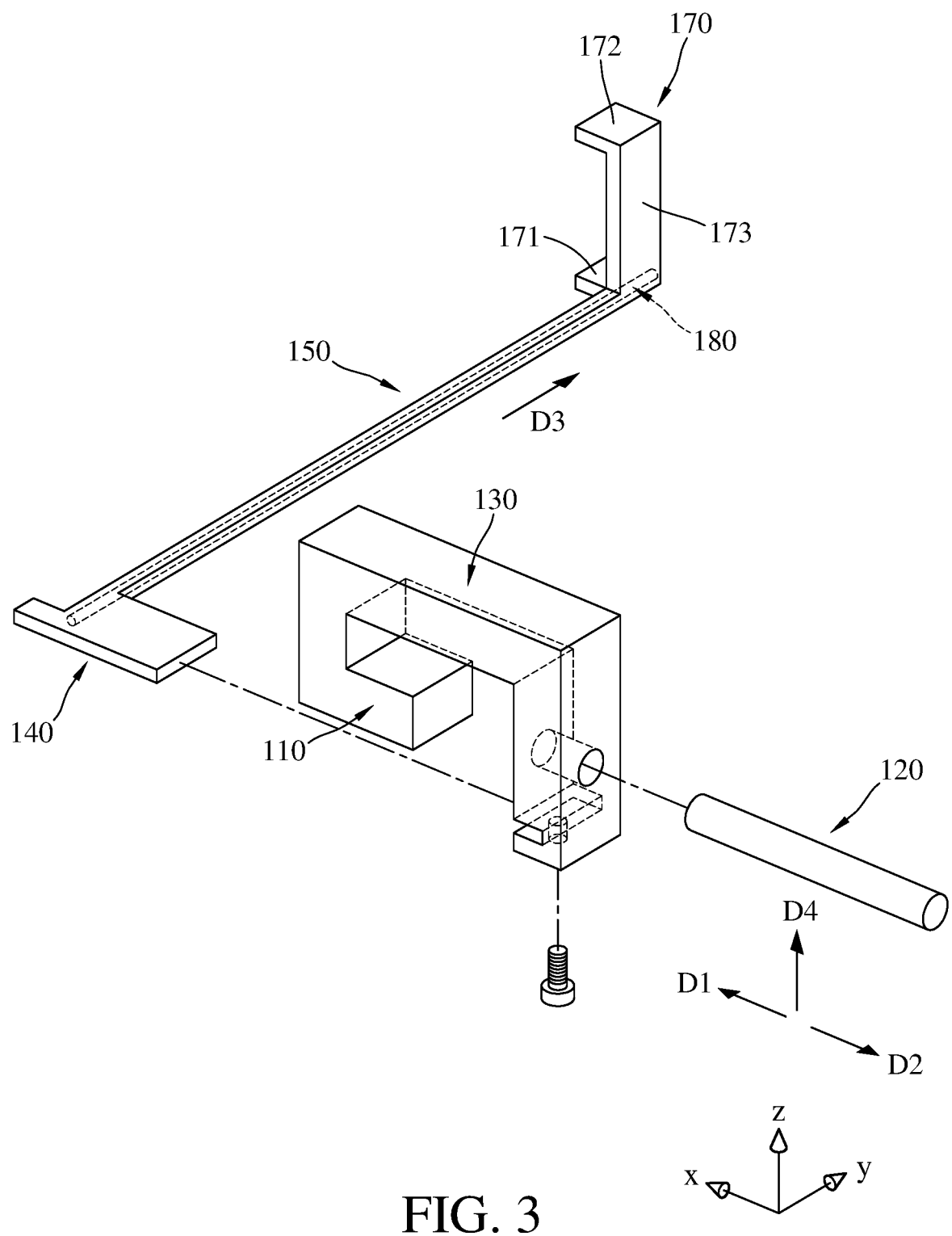
FIG. 3 is an exploded view of the dismantling device in FIG. 1.

In the following detailed description, for purposes of explanation, numerous specific details are set forth in order to provide a thorough understanding of the disclosed embodiments. It will be apparent, however, that one or more embodiments may be practiced without these specific details.

The following embodiments will be described with reference to the drawings. For the purpose of clear illustration, some conventional elements and components may be illustrated in a simple and clear manner. Some of the features in the drawings may be slightly exaggerated or illustrated in a larger proportion for the ease of viewing but are not intended to limit the disclosure. In addition, for the same reason, some of the elements or components in the drawings may be illustrated in dotted lines.

Herein, the terms, such as "end", "part", "portion", "area", may be used to refer to specific features of or between elements or components but are not intended to limit the elements and components. In addition, the terms, such as "substantially" and "approximately", as used herein may mean a reasonable amount of deviation of the described term such that the end result is not significantly changed.

Further, unless explicitly stated, the term "at least one" as used herein may mean that the quantity of the described element or component is one or larger than one but does not necessarily mean that the quantity is only one. The term "and/or" may be used herein to indicate that either or both of two stated possibilities.

Herein, referring to FIGS. 1-4, one embodiment of the disclosure provides a dismantling device 1 suitable for separating a frame 96 from a PV module (also called 'solar panel') 9. The PV module 9 as shown can be any typical PV module in the markets, and its configuration is merely for illustration of the dismantling device 1 but not intended to limit the disclosure.

As shown, the PV module 9 at least includes a laminated structure 90 that contains a backsheet 91, an encapsulant 92, solar cells 93, an encapsulant 94, and a glass plate 95. It is known that PV wastes still contain valuable materials needed to be recovered, such as the solar cells 93 and the glass plate 95 in the laminated structure 90. The frame 96 includes a plurality of first side frame parts 961 and a plurality of second side frame part 962 being arranged along edges of the laminated structure 90 in order to protect the laminated structure 90 and improve the overall structural strength of the PV module 9. The materials of the first side frame parts 961 and the second side frame parts 962 are metal (typically aluminum), thus the frame 96 may also be called 'aluminum frame' and considered as high-value recycling materials.

The first side frame parts 961 and the second side frame parts 962 generally are the same in configuration except for their lengths fitting the edges of the laminated structure 90. As shown, the first side frame parts 961 and the second side frame parts 962 each have a clamping part 960 configured to hold and clamp the edge of the laminated structure 90 (e.g., the clamping part 960 of the first side frame part 961 in FIG. 4). Generally, a suitable adhesive is selectively provided between the clamping part 960 and the laminated structure 90 in order to enhance the connection between the frame 96 and the laminated structure 90, but the adhesive makes it difficult to separate the frame 96 from the laminated structure 90 during the frame dismantling process.

Therefore, the dismantling device 1 is provided to remove the frame 96 in a way not damaging the internal components of the PV module 9 (e.g., the solar cells 93 and glass layer 95 of the laminated structure 90). In detail, in this embodiment, the dismantling device 1 may include a first holding portion 110, a second holding portion 120, a connection portion 130, a supporting portion 140, an extension portion 150, and a pushing portion 170. The first holding portion 110 is connected to the connection portion 130. The first holding portion 110 is, but not limited to, integrally formed with the connection portion 130. The second holding portion 120 is movably disposed through the connection portion 130 and corresponding to the first holding portion 110. In this embodiment, the second holding portion 120 is slidable on the connection portion 130 and is movable in a first direction D1 or a second direction D2 opposite to the first direction D1. Herein, the first direction D1 substantially points towards +X-axis direction, and the second direction D2 substantially points towards −X-axis direction. In such an arrangement, the sliding direction of the second holding portion 120 is substantially along X-axis direction. The second holding portion 120 is able to move toward or away from the first holding portion 110. In other words, the movement of the second holding portion 120 with respect to the connection portion 130 changes the distance between the second holding portion 120 and the first holding portion 110.

In this embodiment, the outer surface of the second holding portion 120 may be threaded (not shown) so as to allows the second holding portion 120 to be screwed into the connection portion 130, allowing user to rotate and move the second holding portion 120 gradually toward or away from the first holding portion 110. It is noted that the second holding portion may not have outer screw threads. In other embodiments, the second holding portion may be secured on the connection portion simply via a tight-fit manner.

The supporting portion 140 is connected to the connection portion 130 and extends towards the first holding portion 110 from the side of the connection portion 130 disposed with the second holding portion 120. As shown, the supporting portion 140 extends in X-axis direction. In this embodiment, the supporting portion 140 is removably disposed on the connection portion 130, as shown, part of the supporting portion 140 is removably embedded into a recess (not numbered) of the connection portion 130, a screw (not numbered) is screwed into the connection portion 130 and has a part entering into the recess to press against the embedded part of the supporting portion 140, securing the position of the supporting portion 140 on the connection portion 130. As such, it is allowed to adjust the position of the supporting portion 140 with respect to the connection portion 130 or remove the supporting portion 140 from the connection portion 130 by rotating the screw. Alternatively, in some embodiments, the supporting portion can be vertically movable with respect to the second holding portion so that the distance between the second holding portion and the supporting portion becomes adjustable, facilitating the installation of the dismantling device onto the module frame. Alternatively, in yet another embodiment, the supporting portion may be integrally formed with the connection portion.

The extension portion 150 is connected to the connection portion 130 via the supporting portion 140 and extends outwards from the supporting portion 140. As shown, the extension portion 150 extends in a third direction D3, where the third direction D3 points towards +Y-axis direction. That is, the sliding direction of the second holding portion 120 is substantially perpendicular to the extension direction of the extension portion 150. In addition, in this embodiment, the extension portion 150 may be integrally formed with the supporting portion 140 or fixed to the supporting portion 140 by welding or other suitable processes, such that the connection portion 130 can be removed from the connection portion 130 along with the supporting portion 140.

The pushing portion 170 is connected to the supporting portion 140 via the extension portion 150, that is, the pushing portion 170 and the supporting portion 140 are respectively located at two opposite ends of the extension portion 150. In this embodiment, the pushing portion 170 may be integrally formed with the extension portion 150 or fixed to the extension portion 150 by welding or other suitable processes, such that the pushing portion 170 can be removed from the connection portion 130 along with the extension portion 150. In more detail, in this embodiment, the pushing portion 170 may include a bottom plate section 171, a top plate section 172, and an abutting section 173 connected between the bottom plate section 171 and the top plate section 172, the top plate section 172 is connected to the extension portion 150 via the abutting section 173. The bottom plate section 171 and the top plate section 172 both extend in the first direction D1 (i.e., +X-axis direction) from the abutting section 173, such that the bottom plate section 171, the top plate section 172, and the abutting section 173 together form a C shape having an opening substantially towards the first direction D1 (i.e., +X-axis direction).

In this embodiment, the dismantling device 1 may have the following configurations and capabilities for it to be installed on the first side frame part 961 or the second side frame part 962 of the frame 96.

The distance between the second holding portion 120 and the first holding portion 110 can be changed to a level that the first holding portion 110 and the second holding portion 120 can together clamp the vertical part of the first side frame part 961 or the second side frame part 962. As shown, the first holding portion 110 can be used to press against an inner wall 9601 of the frame 96, and the second holding portion 120 can be used to press against an outer wall 9602 of the frame 96. The distance between the connection portion 130 and the supporting portion 140 along a fourth direction D4 at least equal to or larger than the height of the first side frame part 961 and the second side frame part 962, where the fourth direction D4 is substantially parallel to Z-axis direction, such that the supporting portion 140 can be used to support a bottom surface 9603 of the frame 96 and the connection portion 130 can be used to contact a top surface 9604 of the frame 96 when the first holding portion 110 and the second holding portion 120 hold the first side frame part 961 or the second side frame part 962, where the bottom surface 9603. Therefore, viewing in the fourth direction D4 (i.e., Z-axis direction), at least part of the supporting portion 140 overlaps with the space between the first holding portion 110 and the second holding portion 120. The distance between the bottom plate section 171 and the top plate section 172 along the fourth direction D4 (i.e., Z-axis direction) at least equal to or larger than the height of the frame 96 (i.e., the vertical distance between the bottom surface 9603 and the top surface 9604), such that the bottom plate section 171 can be used to support the clamping part 960 and the abutting section 173 can be used to press against or contact the outer wall 9602 of the first side frame part 961 or the second side frame part 962. Therefore, viewing in the third direction D3, the bottom plate section 171 of the pushing portion 170 overlaps the supporting portion 140 and the top plate section 172 of the pushing portion 170 overlaps the connection portion 130, and the abutting section 173 of the pushing portion 170 does not overlap the first holding portion 110.

Figure 4:
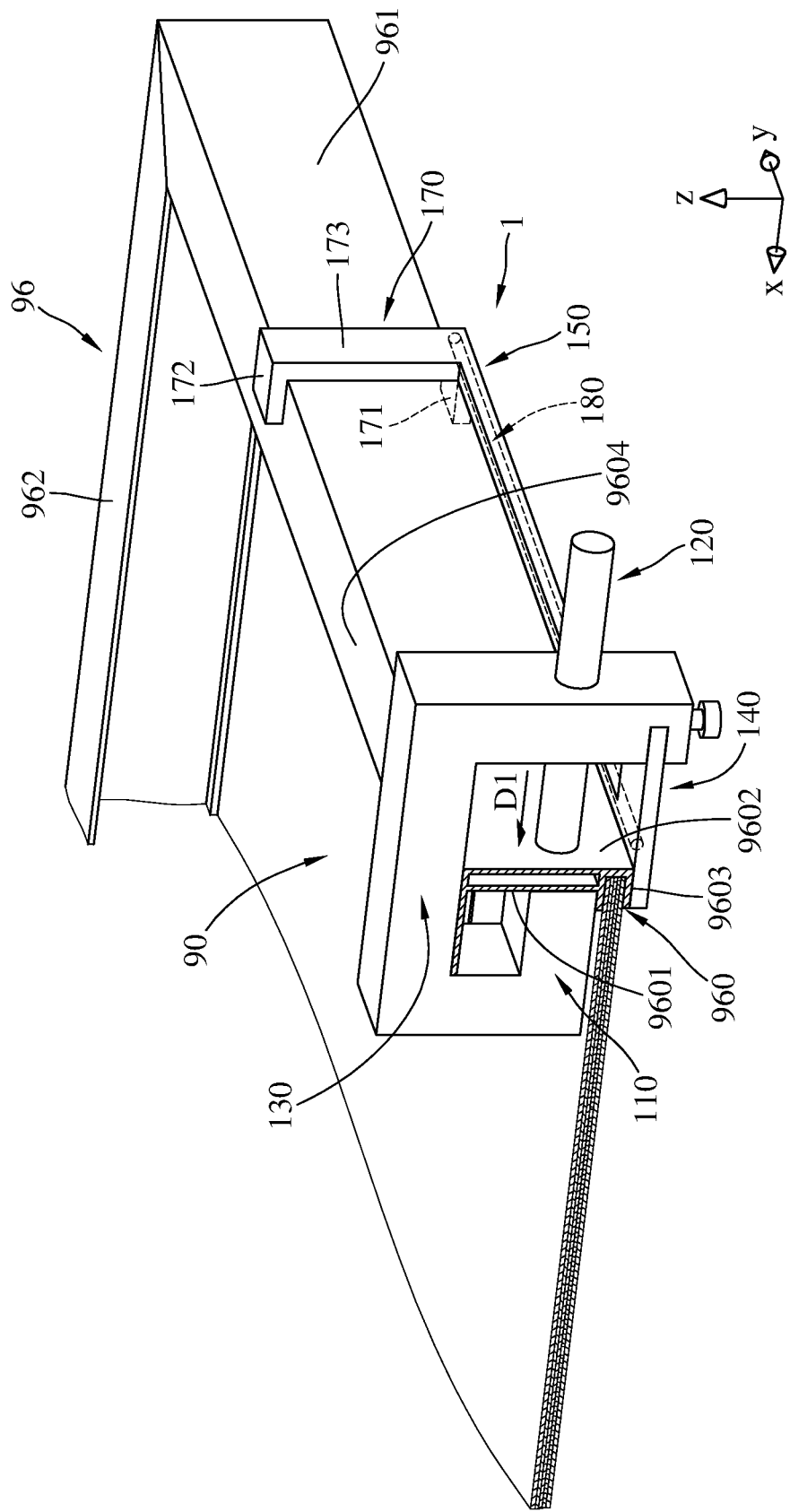
FIG. 4 is a partial enlarged cross-sectional view of the dismantling device and the PV module in FIG. 1.
Figure 5:
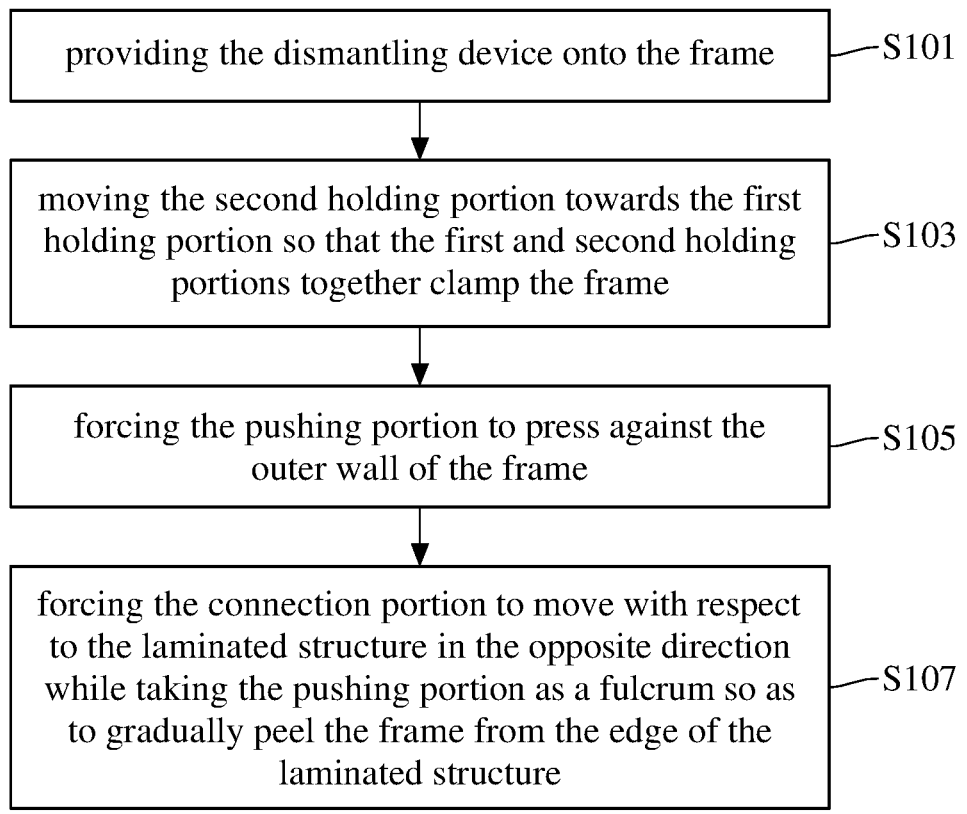
FIG. 5 is a flowchart showing steps of separating frame from the module using the dismantling device according to one embodiment of the disclosure.
Figure 6:
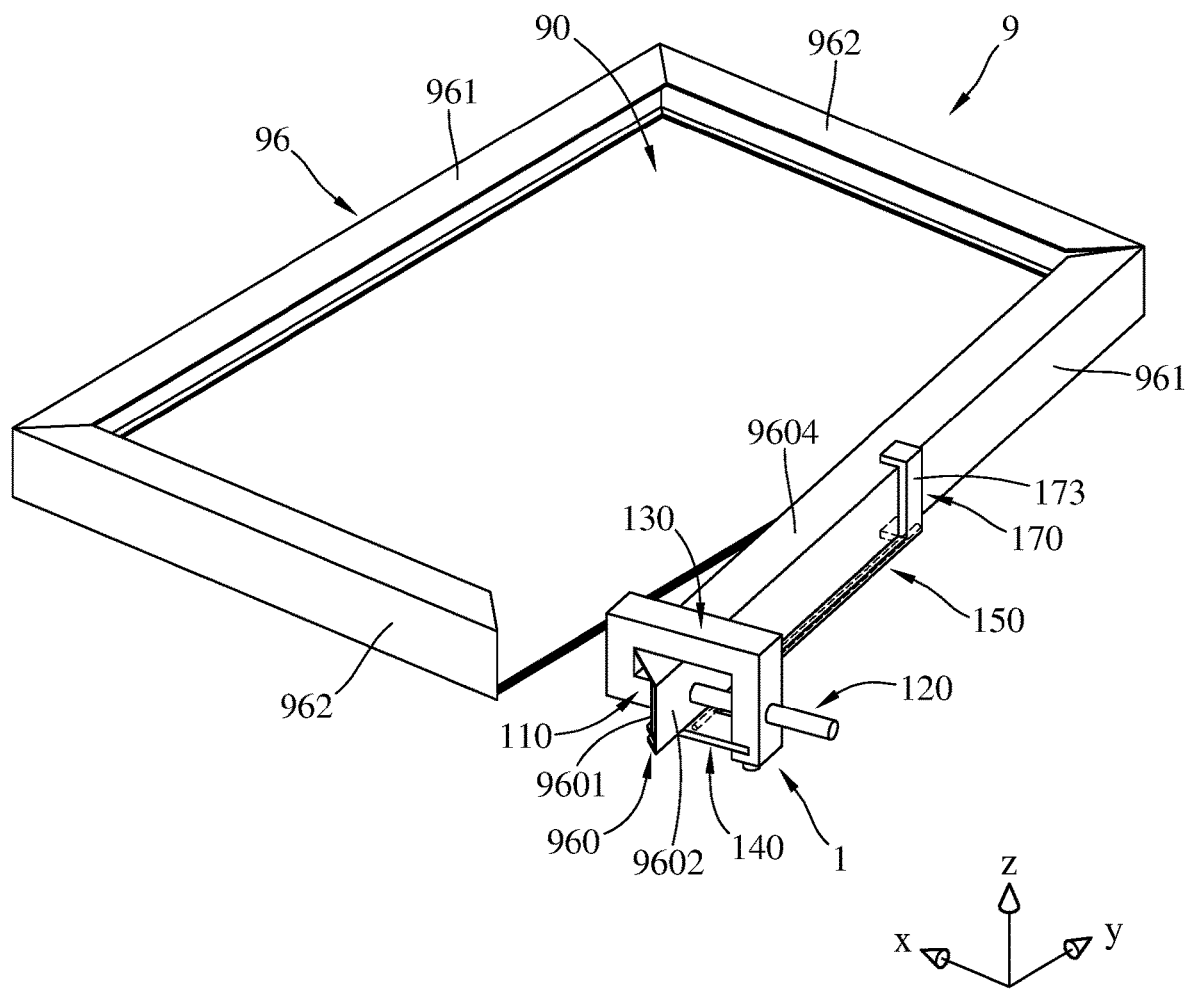
FIGS. 6-7 show the separation of frame by using the dismantling device in FIG. 1.
Figure 7:
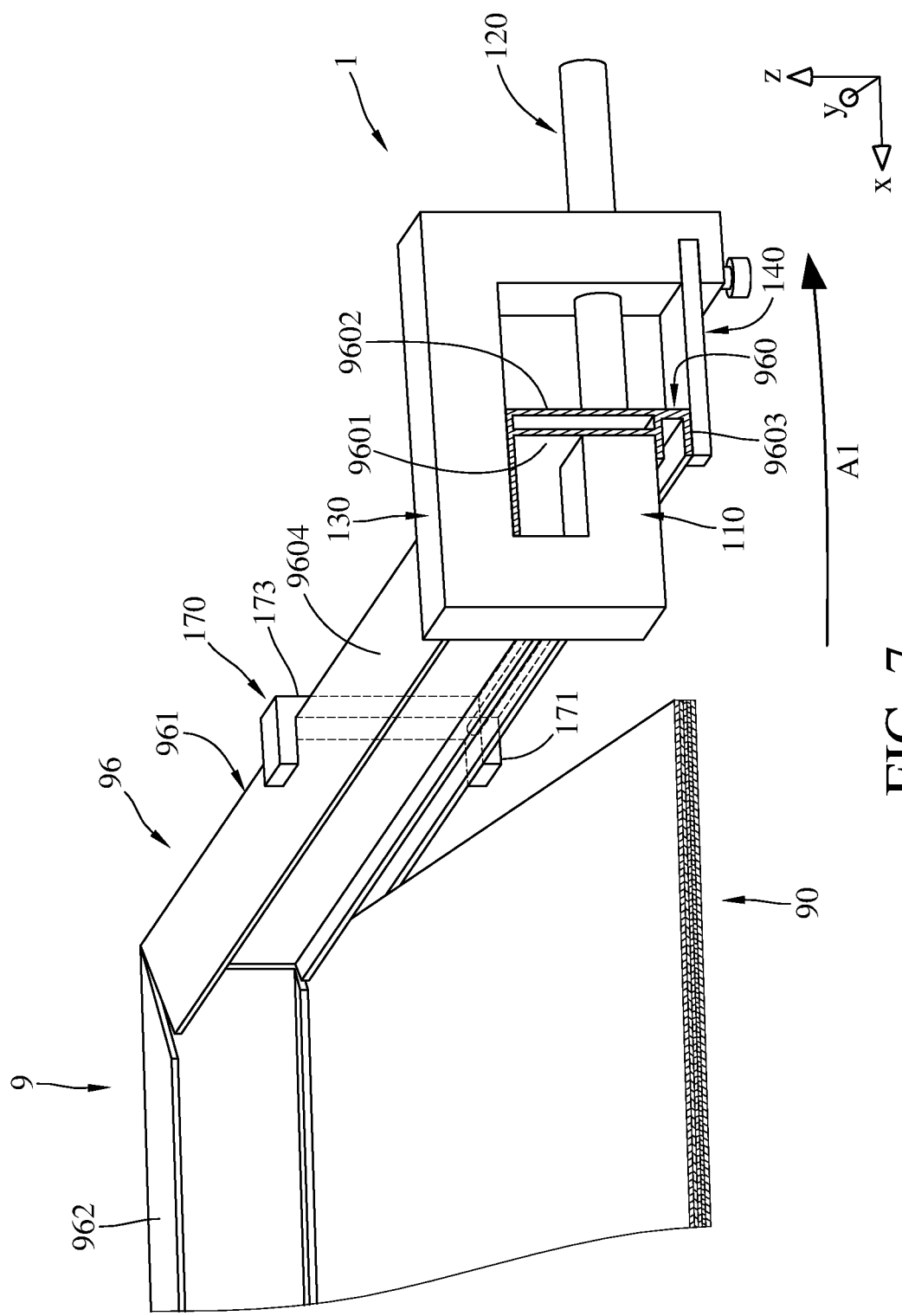

Then, please further refer to FIG. 4 and FIGS. 5-7, the separation of the frame 96 from the PV module 9 by using the dismantling device 1 will be described hereinafter. Firstly, in step S101, the dismantling device 1 is installed on the frame 96. In detail, taking the first side frame part 961 as an example, the second holding portion 120 is moved with respect to the first holding portion 110 so as to make the distance therebetween suitable for installing the dismantling device 1 to the first side frame part 961 as shown in FIG. 1 or FIG. 4. Note that the position of the dismantling device 1 on the first side frame part 961 may still be modified as required.

Then, in step S103, the second holding portion 120 is moved towards the first holding portion 110 (e.g., along the first direction D1) so that the first holding portion 110 and the second holding portion 120 together clamp the first side frame part 961. The process that the first holding portion 110 and the second holding portion 120 are clamping the first side frame part 961 can help position other parts of the dismantling device 1. By doing so, the supporting portion 140 and the bottom plate section 171 of the pushing portion 170 can together support the clamping part 960 and the abutting section 173 of the pushing portion 170 can contact the outer wall 9602.

Then, in step S105, the pushing portion 170 is forced to press against the outer wall 9602 of the frame 96, then or meanwhile, in step S107, the connection portion 130, the first holding portion 110 and/or the second holding portion 120 are forced to move with respect to the laminated structure 90 in the opposite direction while taking the pushing portion 170 as a fulcrum, gradually peeling the frame 96 off from the edge of the laminated structure 90. In detail, the abutting section 173 of the pushing portion 170 is pressured to press against the outer wall 9602 of the first side frame part 961 in the first direction D1 (i.e., +X-axis direction), then or meanwhile, the connection portion 130, the first holding portion 110 and/or the second holding portion 120 are pulled in the second direction D1 (i.e., −X-axis direction), during this process, the first holding portion 110 can push the inner wall 9601 of the first side frame part 961 in the second direction D2 (i.e., −X-axis direction), making the dismantling device 1 a lever with the pushing portion 170 acting as a fulcrum (e.g., the arrow A1 shown in FIG. 7), such that the movement of the first holding portion 110 can gradually peel the first side frame part 961 from the edge of the laminated structure 90. Similarly, the rest part of the first side frame part 961 can be peeled off from the laminated structure 90 by repeating the above steps, and the other first side frame part 961 and second side frame parts 962 can be removed by the same approach.

As discussed, the dismantling device 1 allows user to properly and evenly distribute force to gradually peel the frame 96 off from the PV module 9. As a result, impact and damage on the laminated structure 90 are minimized or even prevented, thereby largely preserving the integrity of the laminated structure 90. Therefore, there is no longer a need to strike or cut the frame to cause backsheet scratches, cracks, or breakages on glass plate and cells. In other words, the dismantling device as discussed in the above embodiments of the disclosure can separate metal frame from PV module without further damaging the laminated structure, achieving a higher recovery/recycling rate and improving the quality of recovered materials.

Specifically, the reasons why the conventional approaches, such as striking or cutting the metal frame, often fail to preserve the laminated structure are that striking force and the striking point are inherently difficult to be controlled and it requires a huge force to be able to separate the frame from the whole edge of the laminated structure, but the excessive force is even much more difficult to be controlled and easily causes a huge impact to shatter the glass plate. In contrast, the operation of the dismantling device 1 can gradually peel the clamping part 960 of the frame 96 off from the edge of the laminated structure 90 while holding the unpeeled part of the clamping part 960 by the pushing portion 170, enabling a proper and continuous evenly-distributed force for separating the frame 96 and thus the removal of the frame 96 becomes more controllable.

It is noted that the configuration of the pushing portion 170 is exemplary and not intended to limit the disclosure. For example, in other embodiments, the pushing portion may omit at least one of the top plate section and the bottom plate section but only keep the abutting section that is used to push the outer wall of the aluminum frame.

It is also noted that the first holding portion 110 and the second holding portion 120 may be switched places as long as they can together clamp and hold the frame 96. For example, in other embodiments, the first holding portion 110 can be used to contact the outer wall 9602 of the frame 96 while the second holding portion 120 can be used to contact the inner wall 9601 of the frame 96.

Figure 8:
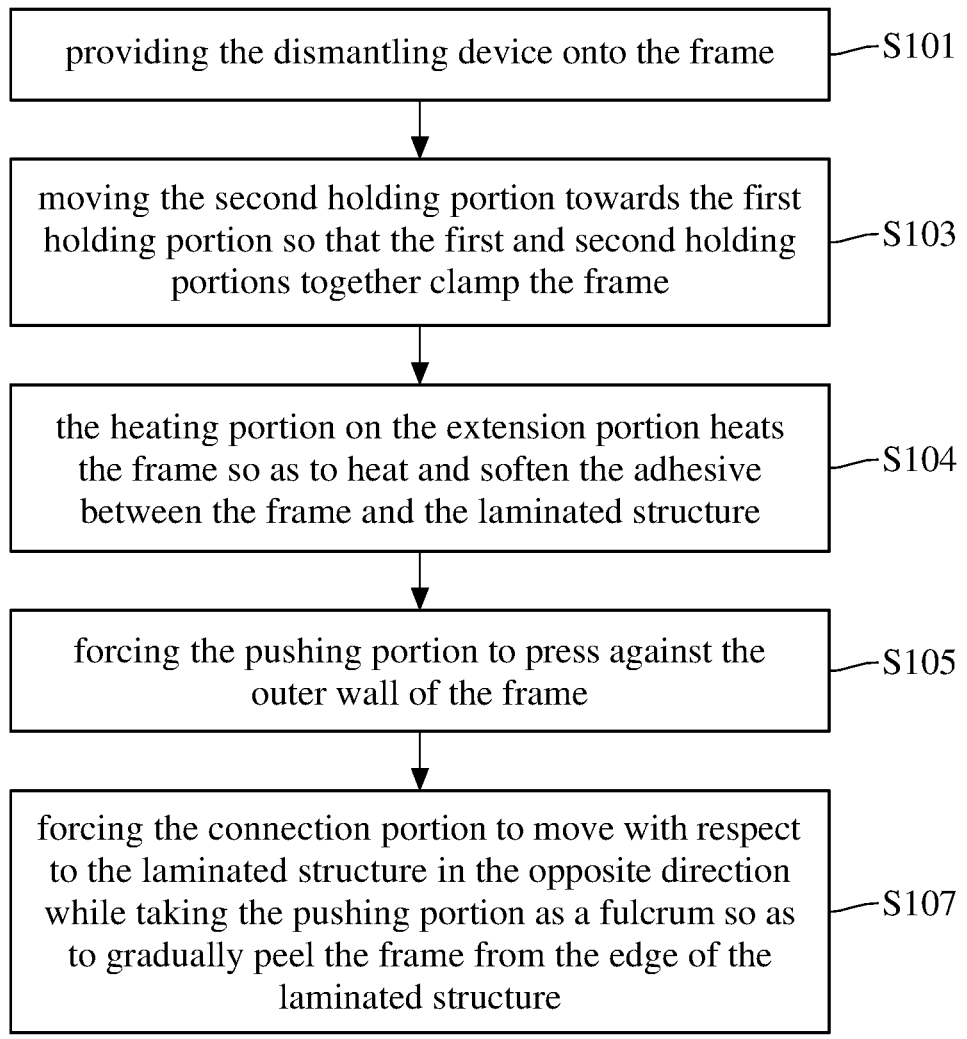
FIG. 8 is another flowchart showing steps of separating frame from the module using the dismantling device according to one embodiment of the disclosure.

Further, to make the separation of the frame 96 from the laminated structure 90 easier, a heater can be embedded in the dismantling device. For example, please refer to FIGS. 1-4 and further refer to FIG. 8, in this embodiment, the dismantling device 1 may further include at least one heating portion 180 partially or completely embedded in the supporting portion 140 and the extension portion 150. As shown, the heating portion 180 extends along the supporting portion 140 and the extension portion 150 (e.g., along the third direction D3), the heating portion 180 may be a single piece or a plurality of sub units separated from one another. The heating portion 180 is made of a material with suitable thermal conductivity. In one embodiment, the heating portion 180 may be a copper wire arranged along the supporting portion 140 and the extension portion 150, which has high thermal conductivity and therefore can generate a high-temperature distribution along the supporting portion 140 and the extension portion 150. It is noted that any suitable means that can create a high-temperature distribution along a specific direction can be served as the heating portion of the disclosure.

Referring to FIG. 4 and FIGS. 6-8, as the dismantling device 1 is installed on the frame 96 (step S101) and the first holding portion 110 and the second holding portion 120 together clamp the frame 96 (step S103), then, in step S104, the heating portion 180 heats the frame 96 in order to heat and soften the adhesive between the frame 96 and the laminated structure 90. In detail, the supporting portion 140 and the extension portion 150 are arranged along the clamping part 960, thus the heat generated by the heating portion 180 thereon can be used to heat the clamping part 960 and therefore melt or soften the adhesive (not shown) between the clamping part 960 and the laminated structure 90, making it gradually lose stickiness. This step can largely reduce the adhesive bonding between the clamping part 960 and the laminated structure 90 and therefore reduce the force needed to peel the first side frame part 961 or the second side frame part 962 from the laminated structure 90. As such, the step S104 can help prevent the force for removing the first side frame part 961 and the second side frame part 962 from being too large during the steps S105 and S107.

Figure 9:
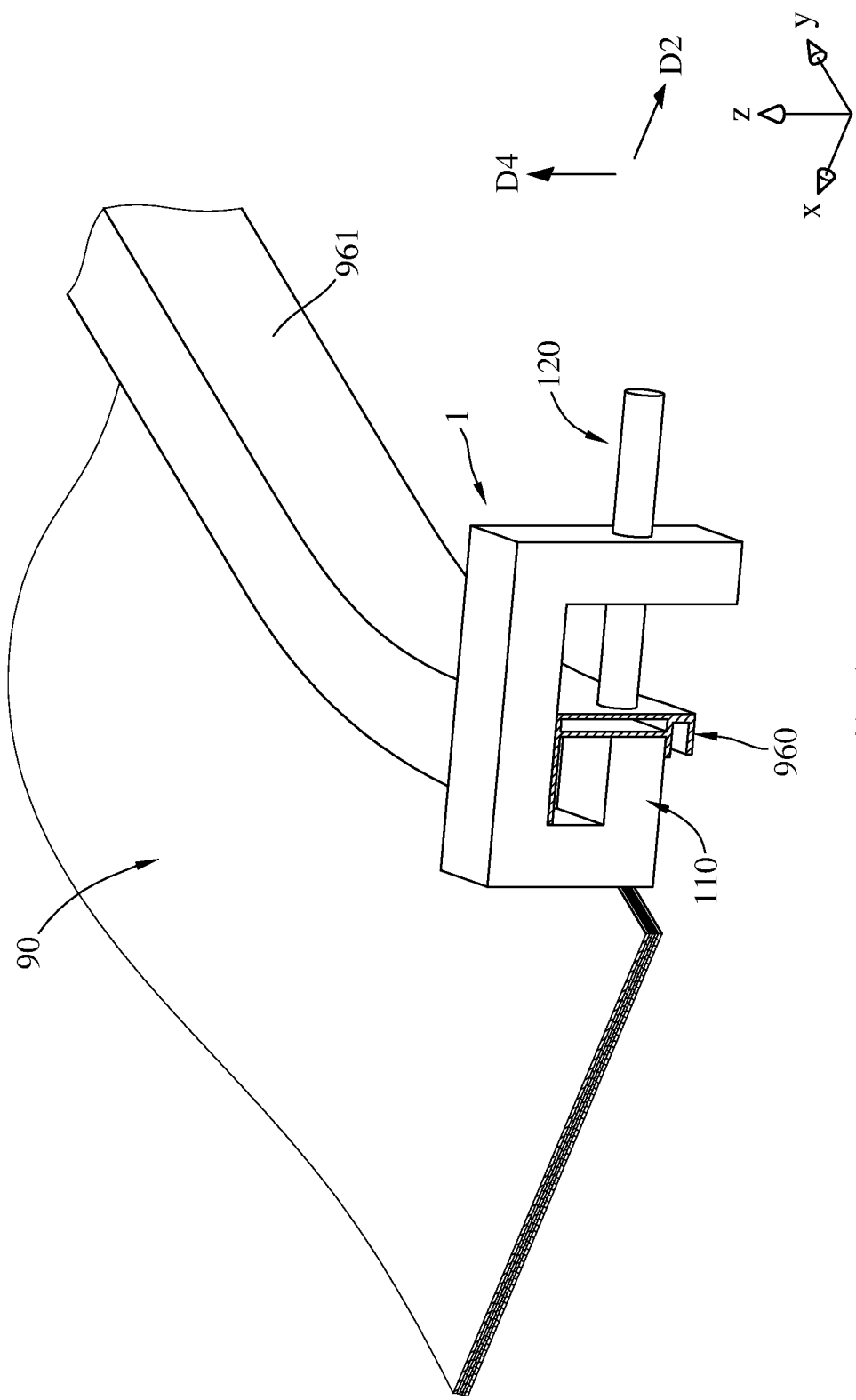
FIG. 9 show the separation of frame by using a dismantling device according to another embodiment of the disclosure.

In some applications, the dismantling device 1 still can remove the frame 96 while the supporting portion 140, the extension portion 150, and the pushing portion 170 are removed. For example, referring to FIG. 9, the removal of the first side frame part 961 or the second side frame part 962 can be achieved merely using the first holding portion 110 and the second holding portion 120. In detail, as the dismantling device 1 is installed on the first side frame part 961, the clamping part 960 of the first side frame part 961 can be gradually peeled off from the laminated structure 90 by rotating the dismantling device 1 about the fourth direction D4 (i.e., Z-axis direction) or push or pull the dismantling device 1 along the second direction D2 (i.e., −X-axis direction), which also can separate the frame 96 from the laminated structure 90 in a way not damaging the laminated structure 90.

Figure 10:
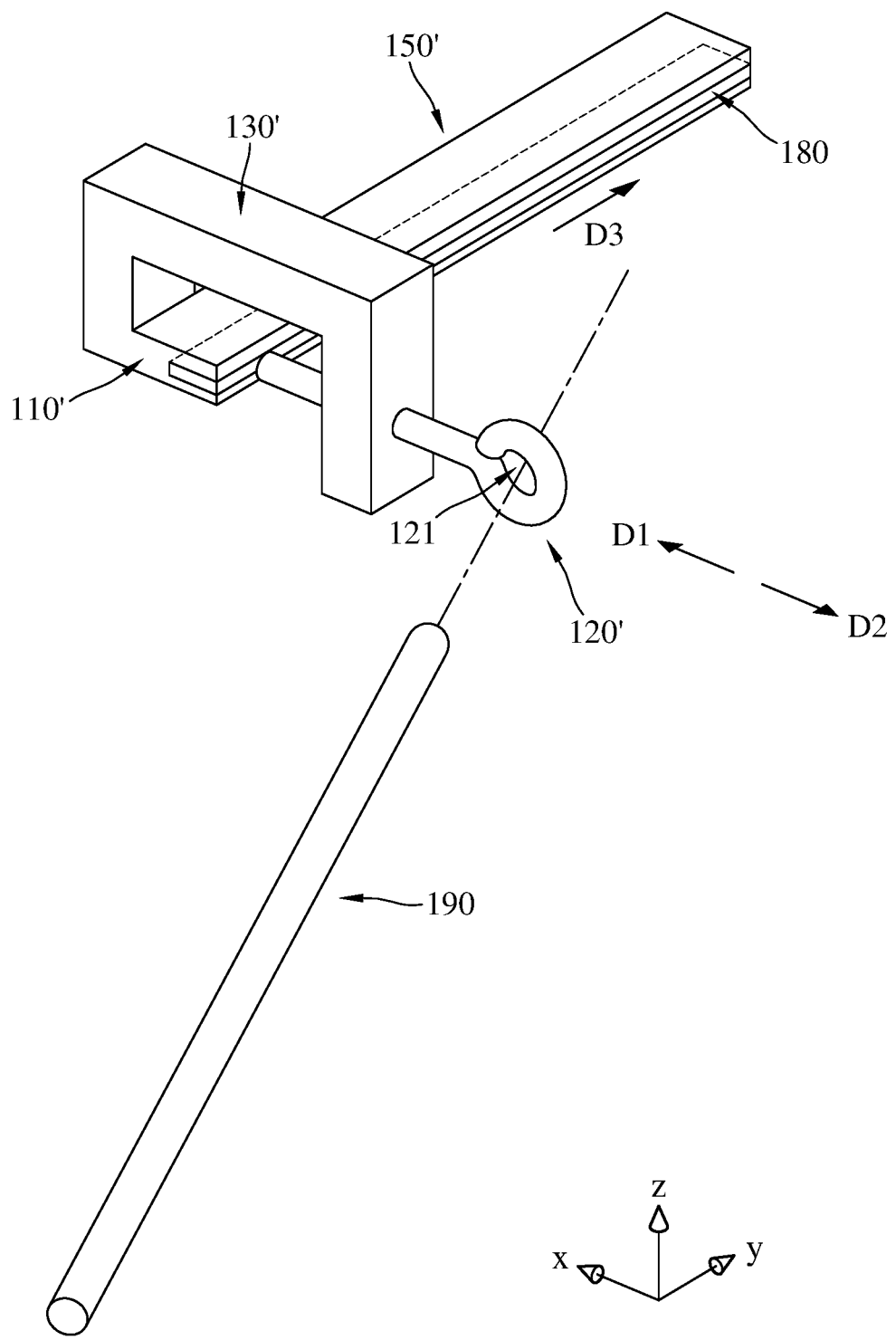
FIG. 10 is a perspective view of a dismantling device according to still another embodiment of the disclosure.

The aforementioned dismantling devices are exemplary and not intended to limit the disclosure. For example, referring to FIGS. 10-11, a dismantling device 1' is provided, but for the purpose of simple illustration, only the differences between the previous and following embodiments will be described in detail, the same or similar parts of them will be designated by the same reference numbers and can be understood with reference to the previous paragraphs so will not be repeated hereinafter.

In this embodiment, dismantling device 1' may include a first holding portion 110', a second holding portion 120', a connection portion 130', an extension portion 150', and a lever 190. The first holding portion 110' is connected to the connection portion 130', the second holding portion 120' is movably disposed through the connection portion 130' and corresponds to the first holding portion 110' and therefore is able to move towards the first holding portion 110' along the first direction D1 or move away from the first holding portion 110' along the second direction D2. In addition, the end of the second holding portion 120' away from the first holding portion 110' has a through hole 121, the lever 190 is in a rod shape being movably disposed through the through hole 121. In some embodiments, the through hole 121 is a circular hole having an inner diameter slightly larger than the outer diameter of the lever 190 so that the lever 190 is allowed to move with respect to the through hole 121 in multi-directions.

The extension portion 150' extends outwards in the third direction D3 (i.e., +Y-axis direction) from the first holding portion 110', the heating portion 180 is partially or completely embedded in the first holding portion 110' and the extension portion 150 so as to generate a high-temperature distribution along the first holding portion 110' and the extension portion 150.

Figure 11:
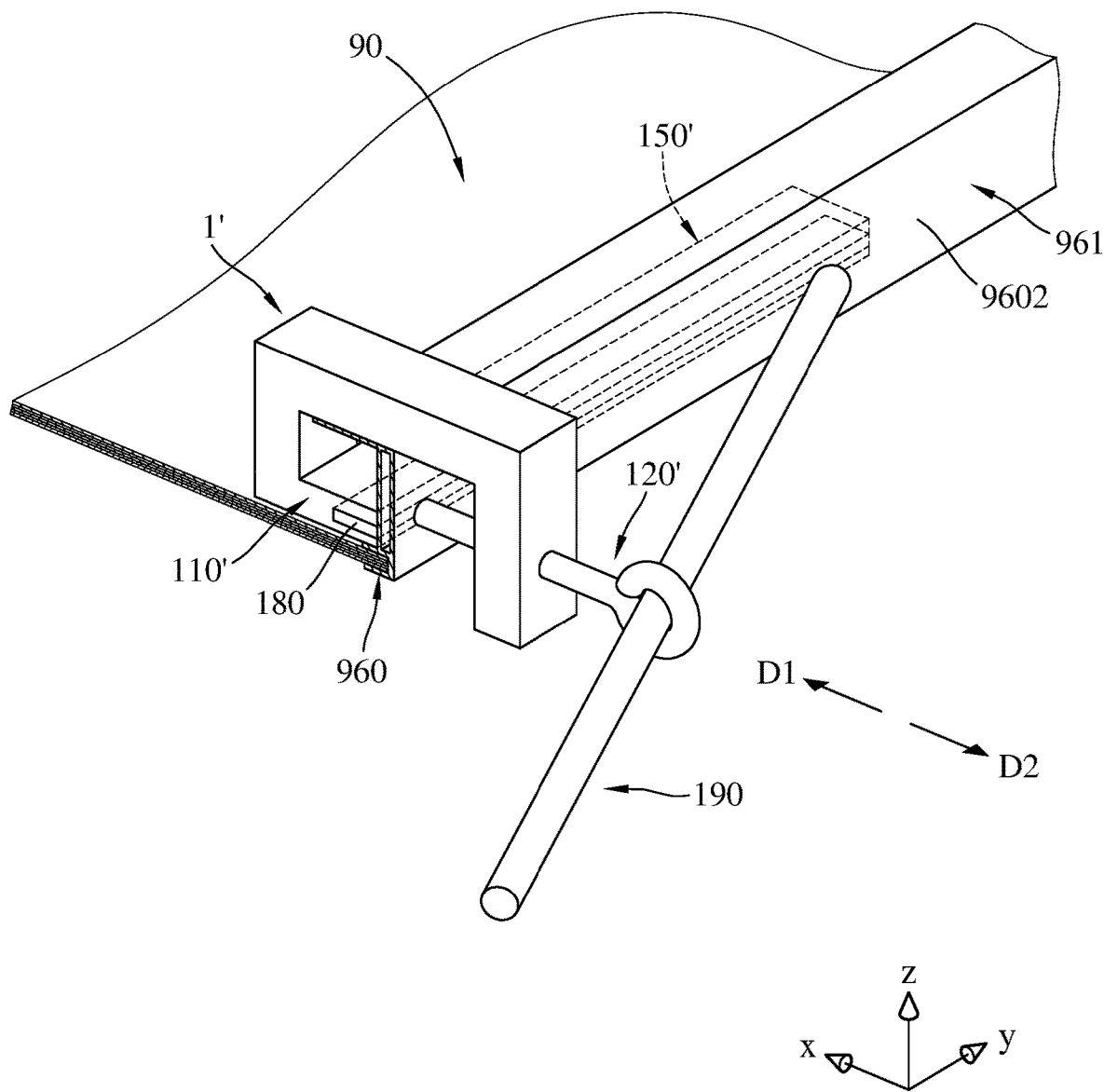
FIG. 11 is a perspective view of the dismantling device in FIG. 10 being installed on a PV module.
Figure 12:
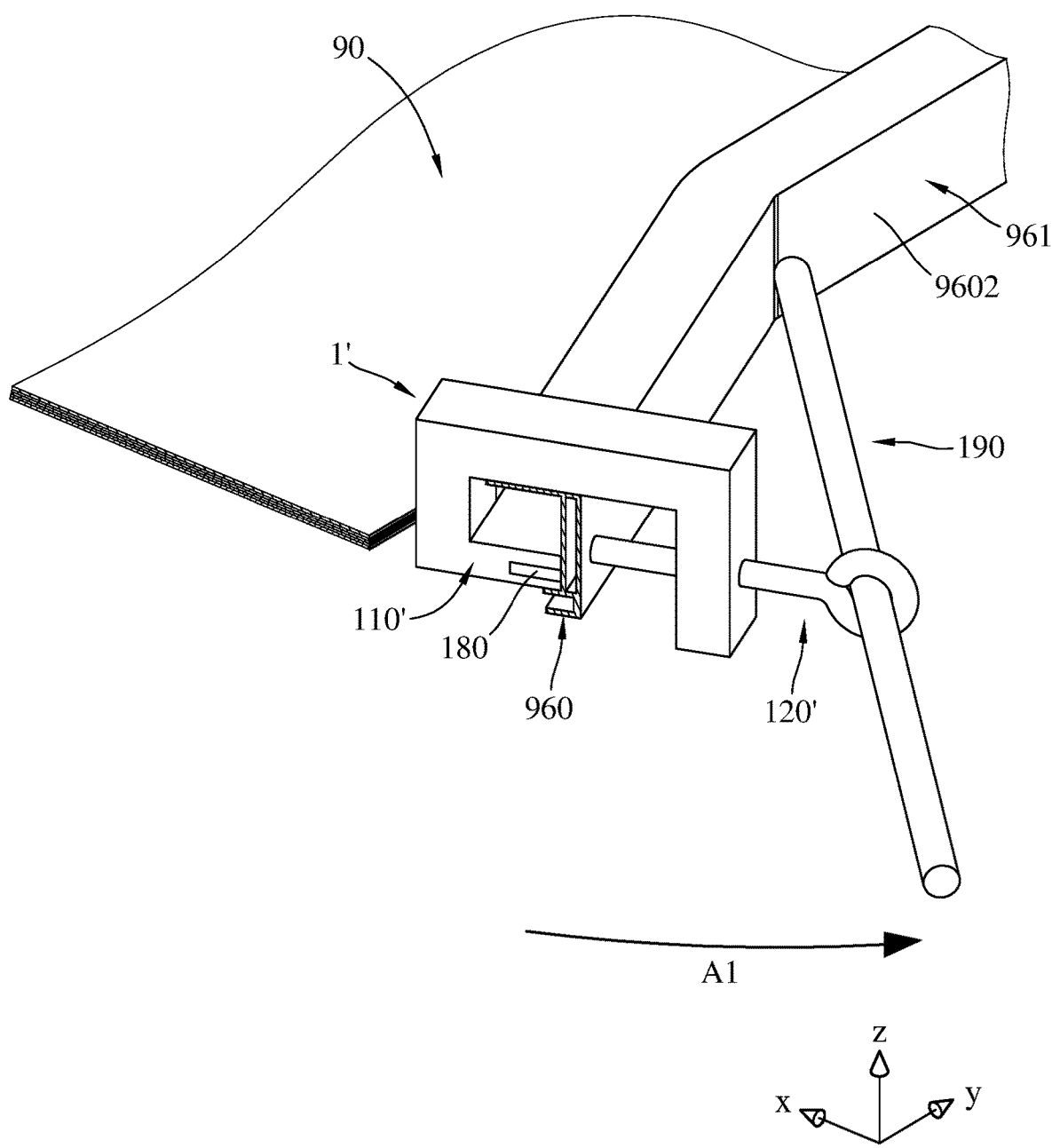
FIG. 12 show the separation of frame by using the dismantling device in FIG. 11.
Figure 13:
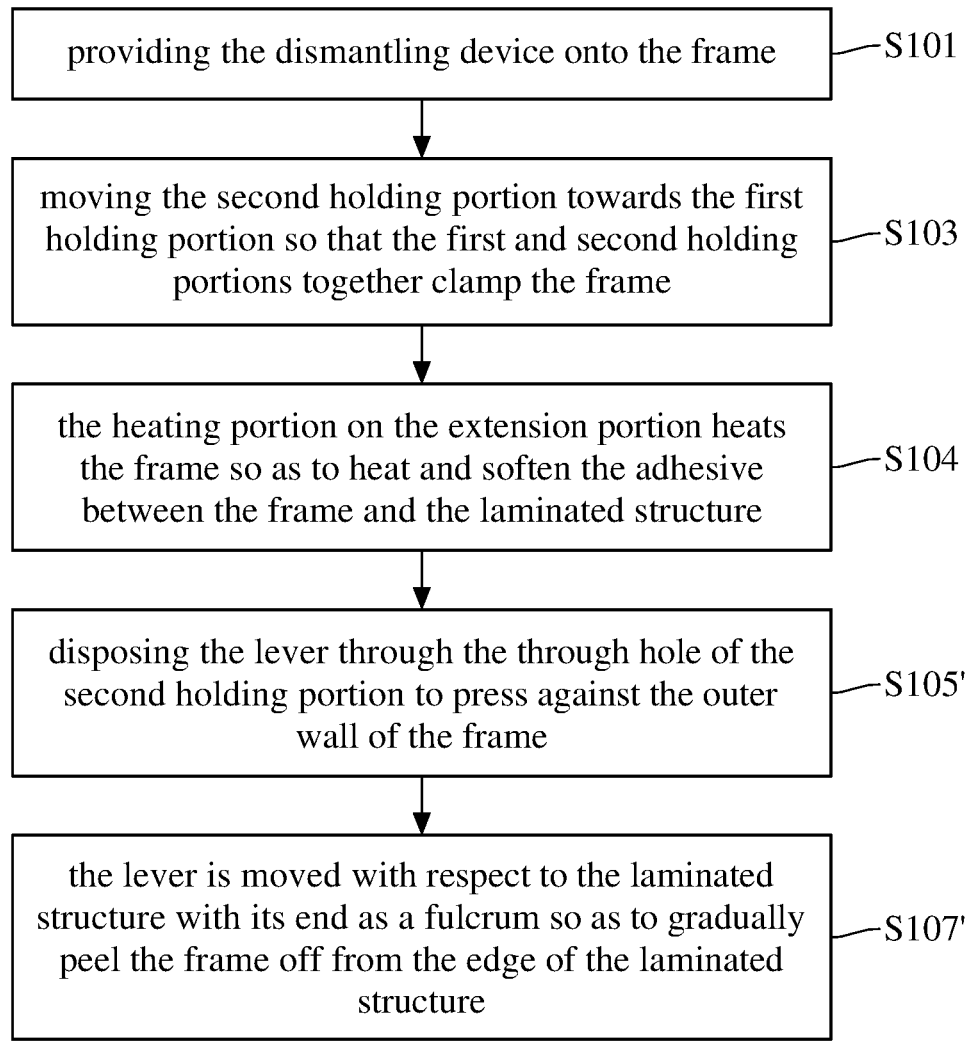
FIG. 13 is another flowchart showing steps of separating frame from the module using the dismantling device according to one embodiment of the disclosure.

Then, refer to FIG. 11 and further refer to FIGS. 12-13, as the dismantling device 1' is installed on the frame 96 (step S101), the first holding portion 110' and the second holding portion 120' together clamp the frame 96 (step S103), and the heating portion 180 heats and soften the adhesive between the frame 96 and the laminated structure 90 (step S104), then the step S105' and step S107' can be performed.

In step S105', the lever 190 is disposed through the through hole 121 of the second holding portion 120' and presses against the outer wall 9602 of the frame 96, then or meanwhile, in step S107', the lever 190 is forced to move with respect to the laminated structure 90 while taking its end as a fulcrum, gradually peeling the frame 96 off from the edge of the laminated structure 90. In detail, one end of the lever 190 is disposed through the through hole 121 at the end of the second holding portion 120' and presses against the outer wall 9602 of the first side frame part 961, then or meanwhile, the lever 190 is rotated away from the outer wall 9602 (e.g., the direction of arrow A1), such that the dismantling device 1' is forced to rotate with respect to the laminated structure 90 about the end that the lever 190 presses against the outer wall 9602, thereby forcing part of the first side frame part 961 to gradually move away from the edge of the laminated structure 90. Similarly, the rest part of the first side frame part 961 can be peeled off from the laminated structure 90 by repeating the above steps, and the other first side frame part 961 and second side frame parts 962 can be removed by the same approach.

Figure 14:
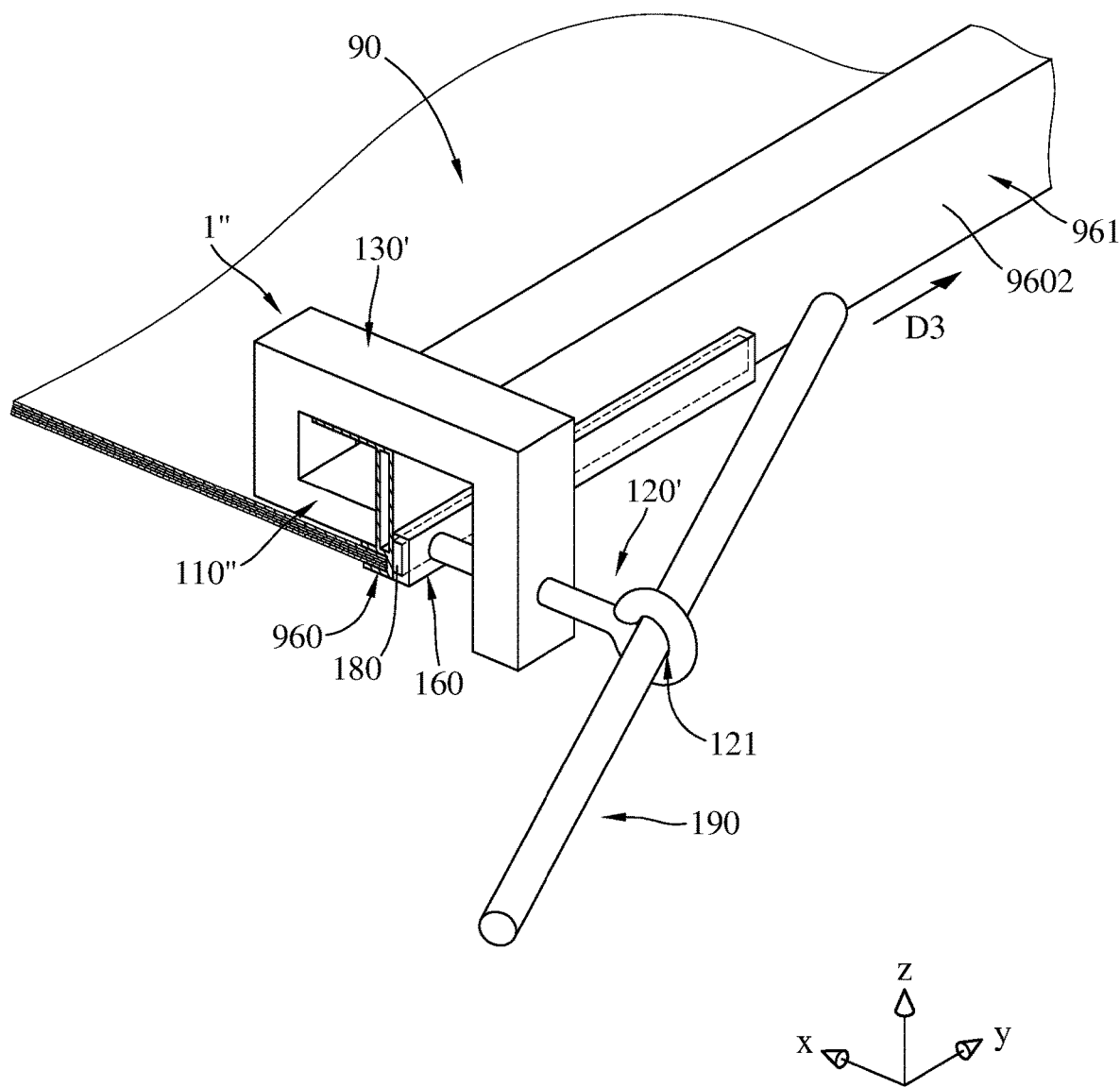
FIG. 14 is a perspective view of a dismantling device being used on a PV module according to still yet another embodiment of the disclosure.

It is noted that the position of the heating portion 180 on the dismantling device can be changed as required. For example, referring to FIG. 14, a dismantling device 1″ is provided, but for the purpose of simple illustration, only the differences between the previous and following embodiments will be described in detail, the same or similar parts of them will be designated by the same reference numbers and can be understood with reference to the previous paragraphs so will not be repeated hereinafter.

In this embodiment, the dismantling device 1″ further includes a holding plate 160 extending in the third direction D3 (i.e., +Y-axis direction) and fixed to the end of the second holding portion 120′. The holding plate 160 is movable with the second holding portion 120′. The holding plate 160 is configured to be attached to the outer side of the clamping part 960 opposite to the laminated structure 90 so that the clamping part 960 will be located between the holding plate 160 and the laminated structure 90 during the dismantling process.

In addition, in this embodiment, the heating portion 180 is arranged along the holding plate 160, in specific, the heating portion 180 may be arranged at the side of the holding plate 160 that is used to contact the clamping part 960. As such, the heating portion 180 can be in thermal contact with the part of the outer wall 9602 of the frame 96 that is close to the clamping part 960, that is, the heating portion 180 can be very close to the adhesive between the clamping part 960 and the laminated structure 90 so as to be more effectively soften the adhesive.

It is noted that the heating portion 180 is optional and not intended to limit the disclosure. For example, in some other embodiments, the dismantling device may omit the heating portion 180, in such a case, the dismantling device may also omit the extension portion. Further, the aforementioned dismantling devices can be operated manually or operated automatically by cooperating with automotive apparatus.

According to the dismantling device as discussed in the above embodiments of the disclosure, the second holding portion is movable close to or away from the first holding portion so as to clamp and deform the frame together with the first holding portion, which allows user to gradually peel the frame off from the PV module by simply pulling, pushing, and/or rotating the dismantling device while largely preserving the integrity of the laminated structure.

As such, it is allowed to properly and evenly distribute force to dismantle the frame from the module. As a result, impact and damage on the internal components caused by the removal of the frame is minimized or even prevented, thus there is no longer a need to strike or cut the frame to cause backsheet scratches, cracks or breakages on glass plate and cells. In other words, the dismantling device as discussed in the above embodiments of the disclosure can separate frame from module without further damaging the internal components, achieving higher recovery/recycling rate and improving the quality of recovered materials.

In some embodiments, the dismantling device may further include a pushing portion extending from the extension portion and used to press against the outer wall of the frame while the first holding portion and the second holding portion clamping the frame, thus while the connection portion, the first holding portion and/or the second holding portion is forced to push or pull the frame, the dismantling device can be rotated as a lever with the pushing portion acting as a fulcrum to gradually peel the frame from the edge of the laminated structure.

In some embodiments, the dismantling device may further include a lever that can be disposed through the through hole at the end of the second holding portion and to press against the outer wall of the frame, thus the dismantling device can be rotated by taking the end of the lever as a fulcrum to gradually peel the frame from the edge of the laminated structure.

In addition, in some embodiments, the dismantling device may further include a heating portion arranged along the extension portion to create a high-temperature distribution along the extension portion to reduce or remove the stickiness of the adhesive between the frame and the laminated structure before the removal of the frame, and thereby reducing the force needed to peel the frame from the laminated structure and preventing the force for removing the frame from being too large to damage the laminated structure.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A dismantling device, configured for a frame of a PV module, the dismantling device comprising:
   a connection portion;
   a first holding portion, connected to the connection portion and configured to press against one of an inner wall and outer wall of the frame; and
   a second holding portion, slidably disposed on the connection portion and movably closer to or away from the first holding portion along a sliding direction, the second holding portion configured to press against the other one of the inner wall and the outer wall so as to clamp the frame with the first holding portion and to distort the frame.

2. The dismantling device according to claim 1, further comprising an extension portion and a pushing portion, wherein the extension portion is connected to the connection portion and has an extension direction substantially perpendicularly to the sliding direction of the second holding portion, and the pushing portion is connected to the connection portion via the extension portion and configured to contact the outer wall of the frame.

3. The dismantling device according to claim 2, further comprising a supporting portion, wherein the extension portion is connected to the connection portion via the supporting portion, and the supporting portion is configured to support a bottom surface of the frame.

4. The dismantling device according to claim 3, wherein the supporting portion is removably disposed on the connection portion.

5. The dismantling device according to claim 3, wherein in a direction that is substantially perpendicularly to the extension direction of the extension portion and the sliding direction of the second holding portion, at least part of the first holding portion overlaps the supporting portion.

6. The dismantling device according to claim 2, wherein the pushing portion comprises an abutting section and a bottom plate section connected to one end of the abutting section, the abutting section is configured to contact the outer wall of the frame, and the bottom plate section is configured to support a bottom surface of the frame.

7. The dismantling device according to claim 6, wherein the pushing portion further comprises a top plate section connected to another end of the abutting section and configured to contact a top surface of the frame.

8. The dismantling device according to claim 1, further comprising an extension portion and a heating portion, wherein the extension portion is connected to the connection portion and has an extension direction substantially perpendicularly to the sliding direction of the second holding portion, and the heating portion is arranged along the extension portion and configured to heat the frame.

9. The dismantling device according to claim 1, further comprising a lever, wherein the second holding portion has a through hole located at an end of the second holding portion located away from the first holding portion, the lever is movably disposed through the through hole and has an end configured to press against the outer wall of the frame and served as a fulcrum of the dismantling device.

10. The dismantling device according to claim 1, further comprising a holding plate and a heating portion, wherein the holding plate is fixed at an end of the second holding portion and configured to contact with the frame, and the heating portion is arranged along the holding plate and configured to heat the frame.

* * * * *